United States Patent
Lee et al.

(10) Patent No.: US 7,196,941 B2
(45) Date of Patent: Mar. 27, 2007

(54) SEMICONDUCTOR MEMORY DEVICE AND METHOD FOR WRITING AND READING DATA

(75) Inventors: Yun-Sang Lee, Yongin (KR); Jung-Bae Lee, Yongin (KR); Jung-Hwan Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 178 days.

(21) Appl. No.: 10/798,469

(22) Filed: Mar. 11, 2004

(65) Prior Publication Data

US 2004/0233734 A1    Nov. 25, 2004

(30) Foreign Application Priority Data

May 20, 2003    (KR) ...................... 10-2003-0032053

(51) Int. Cl.
*G11C 7/10* (2006.01)

(52) U.S. Cl. ............ 365/189.04; 365/190; 365/230.03; 365/230.05

(58) Field of Classification Search ........... 365/189.01, 365/189.04 X, 190 X, 230.01, 230.03 X, 365/230.05 X
See application file for complete search history.

(56) References Cited

U.S. PATENT DOCUMENTS

| | | | | |
|---|---|---|---|---|
| 6,418,067 B1 * | 7/2002 | Watanabe et al. | ........... | 365/200 |
| 6,519,192 B2 * | 2/2003 | Ooishi | ........... | 365/200 |
| 6,542,428 B2 * | 4/2003 | Hidaka | ........... | 365/230.03 |
| 6,665,209 B2 * | 12/2003 | Osada et al. | ........... | 365/154 |
| 6,847,346 B2 * | 1/2005 | Kumagai et al. | ........... | 345/98 |

* cited by examiner

*Primary Examiner*—VanThu Nguyen
(74) *Attorney, Agent, or Firm*—Mills & Onello LLP (57) ABSTRACT

A semiconductor memory device and a method for writing and reading data to and from the same comprises a memory cell array including a plurality of memory cells connected between a plurality of word lines and a plurality of bit line pairs, a predetermined number of write line pairs, a predetermined number of read line pairs, a plurality of write column selection gates for transmitting data between the plurality of bit line pairs and the predetermined number of write line pair during a write operation, and a plurality of read column selection gates for transmitting data between the plurality of bit line pairs and the predetermined number of read line pairs during a read operation. Accordingly, it is possible to input and output data simultaneously through data input pads and data output pads.

16 Claims, 5 Drawing Sheets

SEMICONDUCTOR MEMORY DEVICE AND METHOD FOR WRITING AND READING DATA

This U.S. nonprovisional patent application claims priority under 35 U.S.C. § 119 of Korean Patent Application 2003-32053 filed on May 20, 2003, the entire contents of which are hereby incorporated by reference.

BACKGROUND OF THE INVENTION

1. Field of the Invention

The present invention relates in general to a semiconductor memory device and, more particularly, to a semiconductor memory device and a method for writing and reading data to and from the same.

2. Description of the Related Art

A general semiconductor memory device inputs data from an external source, and outputs internally generated data through data input and output pins. Accordingly, the general semiconductor memory device could not perform data writing operations and data reading operations simultaneously.

Some general semiconductor memory devices have data input pads and data output pads formed separately. However, these kinds of devices do not transmit data through the data input pads and the data out pads simultaneously. That is, the data write lines and data read lines in the semiconductor memory device are not separated but constituted commonly like a semiconductor memory device in which data input pads and data output pads are adapted to be used commonly.

Accordingly, a conventional semiconductor memory device could not perform data input operations through data input/output (input) pads and data output operations through data input/output (output) pads simultaneously.

In order to enhance a bus efficiency of a system including semiconductor memory devices, it is necessary to provide a semiconductor memory device which performs data input and output simultaneously.

SUMMARY OF THE INVENTION

Therefore, it is an object of the present invention to provide a semiconductor memory device which can perform data input and output simultaneously.

It is another object of the present invention to provide a method for writing and reading data to and from a semiconductor memory device simultaneously.

The above object can be accomplished by the provision of a semiconductor memory device comprising: a memory cell array including a plurality of memory cells connected between a plurality of word lines and a plurality of bit line pairs; a predetermined number of write line pairs; a predetermined number of read line pairs; a plurality of write column selection gates for transmitting data between the plurality of bit line pairs and the predetermined number of write line pairs during a write operation; and a plurality of read column selection gates for transmitting data between the plurality of bit line pairs and the predetermined number of read line pairs during a read operation.

In accordance with another aspect of the present invention, there is provided a semiconductor memory device comprising: a memory cell array including a plurality of memory cell array blocks each including a plurality of memory cells connected between a plurality of word lines and a plurality of bit line pairs; a predetermined number of local write line pairs of each of the plurality of memory cell array blocks for inputting data in each of the plurality of memory cell array blocks; a predetermined number of local read line pairs of each of the plurality of memory cell array blocks for outputting data of each of the plurality of memory cell array blocks; a plurality of write column selection gates of each of the plurality of memory cell array blocks for transmitting data between the plurality of bit line pairs and the predetermined number of local write line pairs during a write operation; read column selection gates of each of the plurality of memory cell array blocks for transmitting data between the plurality of bit line pairs and the predetermined number of local read line pairs during a read operation; a predetermined number of global write line pairs connected to the predetermined number of local write line pairs of each of the plurality of memory cell array blocks; and a predetermined number of global read line pairs connected to the predetermined number of local read line pairs of each of the plurality of memory cell array blocks.

In accordance with yet another aspect of the present invention, there is provided a semiconductor memory device comprising: a memory cell array including a plurality of memory cell array blocks each including a plurality of memory cells connected between a plurality of word lines and a plurality of bit line pairs; a predetermined number of local write line pairs of each of the plurality of memory cell array blocks for inputting data in each of the plurality of memory cell array blocks; a predetermined number of local read line pairs of each of the plurality of memory cell array blocks for outputting data of each of the plurality of memory cell array blocks; a plurality of write column selection gates of each of the plurality of memory cell array blocks for transmitting data between the plurality of bit line pairs and the predetermined number of local write line pairs during a write operation; read column selection gates of each of the plurality of memory cell array blocks for transmitting data between the plurality of bit line pairs and the predetermined number of local read line pairs during a read operation; a write column decoder for generating write column selection signals to select a predetermined number of write column selection gates among the plurality of write column selection gates by inputting a column address during the write operation; a read column decoder for generating read column selection signals to select a predetermined number of read column selection gates among the plurality of read column selection gates by inputting the column address during the read operation; a predetermined number of global write line pairs connected to a predetermined number of local write line pairs of each of the plurality of memory cell array blocks; a predetermined number of global read line pairs connected to a predetermined number of local read line pairs of each of the plurality of memory cell array blocks; a data input circuit for transmitting data input to a predetermined number of data input pads to the predetermined number of global write line pairs; a data output circuit for outputting data transmitted from the predetermined number of global read line pairs to a predetermined number of data output pads; and a command decoder for decoding externally input command signals and generating a write command for the write operation and a read command for the read operation.

Preferably, the command decoder of the present invention further decodes the command signals to generate the write and the read commands for performing the write and the read operations simultaneously.

Preferably, the semiconductor memory device of the present invention may further comprise a first switch for transmitting data input to a predetermined number of data input pads to the data input circuit in response to a control signal, and transmitting data transmitted from the data output circuit to a predetermined number of data output pads; and a second switch for transmitting data input through the predetermined number of data output pads in response to an inverted signal of the control signal to the data input circuit, and transmitting data output from the data output circuit to the predetermined number of data input pads, the data input pad being used as data output pad and the data output pad being used as data input pad.

In accordance with yet another aspect of the present invention, there is provided a method for writing and reading data to and from a semiconductor memory device comprising the steps of transmitting data input through a first pad to write line pairs during a write operation, and transmitting data output from a memory cell array to read line pairs during a read operation; and transmitting data transmitted to the write line pair to the memory cell array during a write operation, and outputting data transmitted to the read line pair through a second pad during a read operation.

In accordance with yet another aspect of the present invention, there is provided a method for writing and reading data to and from a semiconductor memory device comprising the steps of transmitting data input through a data input (output) pad to global write line pair during the write operation, and transmitting data stored in a memory cell array to a local read line pair during the read operation; transmitting data transmitted to the global write line pair to a local write line pair during the write operation, and transmitting data transmitted to the local read line pair to a global read line pair during the read operation; and transmitting data transmitted to the local write line pair to the memory cell array during a write operation, and transmitting data transmitted to the global read line pair to the local read line pair and outputting data transmitted to the local read line pair through a data output (input) pad during the read operation.

Preferably, the write operation and the read operation of the semiconductor memory device of the present invention may be performed independently or simultaneously.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Hereinafter, a semiconductor memory device and a method for writing and reading data to and from the same in accordance with the present invention will be described in connection with the accompanying drawings.

Figure 1:
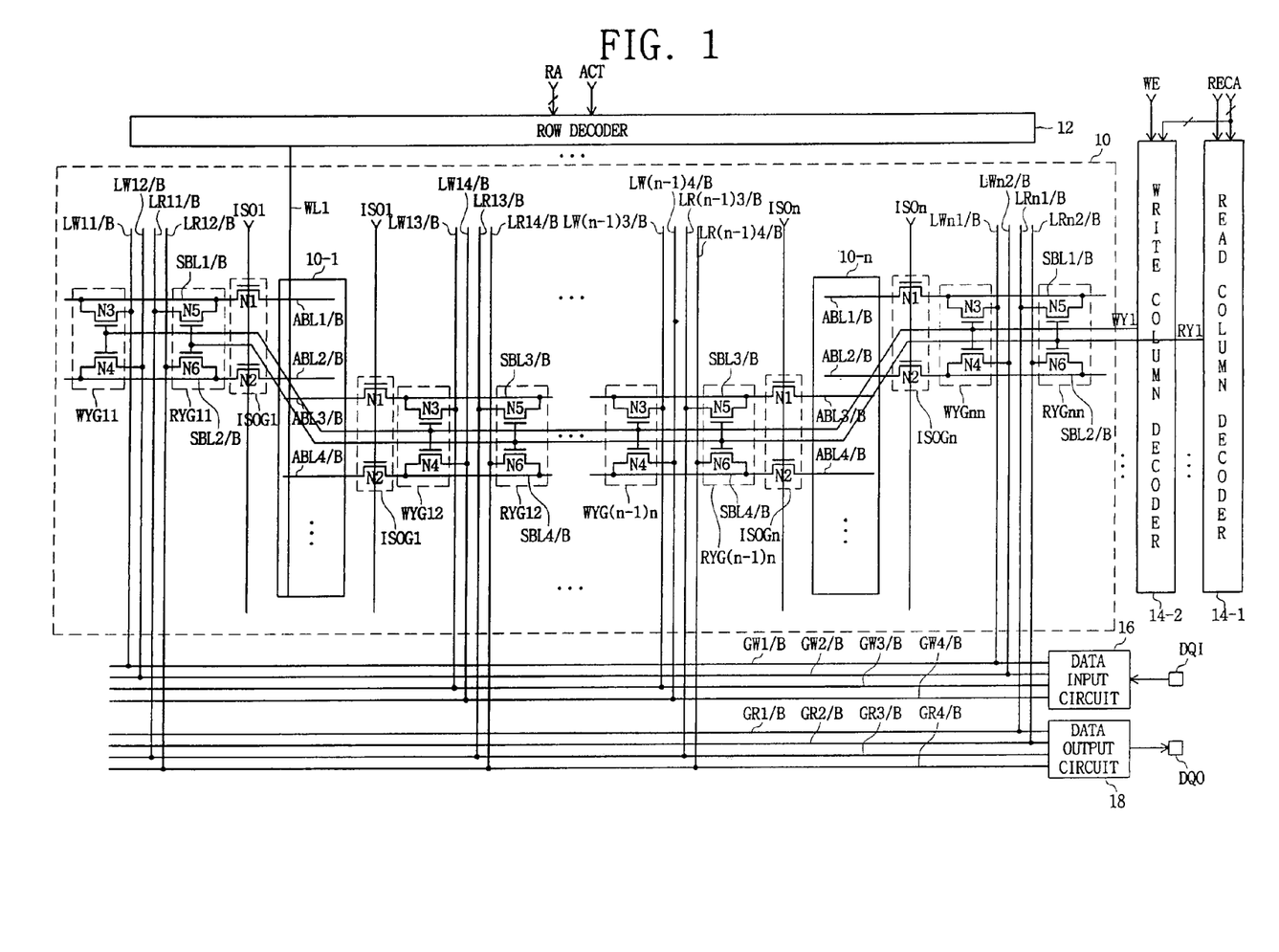
FIG. 1 is a block diagram illustrating a construction of a semiconductor memory device in accordance with an embodiment of the present invention.

FIG. 1 is a block diagram illustrating a construction of a semiconductor memory device in accordance with an embodiment of the present invention, including a memory cell array 10 which includes a plurality of memory cell array blocks 10-1 to 10-n, a row decoder 12, a read column decoder 14-1, a write column decoder 14-2, a data input circuit 16 and a data output circuit 18.

Referring to FIG. 1, the memory cell array 10 includes the plurality of memory cell array blocks 10-1 to 10-n. Each of the plurality of memory cell array blocks 10-1 to 10-n has bit line isolation gates ISOG1 to ISOGn, write column selection gates (WYG11, WYG12) to (WYG(n−1)n, WYGnn), and read column selection gates (RYG11, RYG12) to (RYG(n−1)n, RYGnn) to the left and the right sides of it. And each of the plurality of memory cell array blocks 10-1 to 10-n has corresponding local write line pairs (LW11/B, LW12/B, LW13/B, LW14/B) to (LW(n−1)3/B, LW(n−1)4/B, LWn1/B, LWn2/B), and corresponding local read line pairs (LR11/B, LR12/B, LR13/B, LR14/B) to (LR(n−1)3/B, LR(n−1)4/B, LRn1/B, LRn2/B) to the left and the right sides of it. Local write line pairs (LW13/B, LW14/B, . . . , LW(n−1)3/B, LW(n−1)4/B) and local read line pairs (LR13/B, LR14/B, . . . LR(n−1)3/B, LR(n−1)4/B) among the plurality of memory cell array blocks 10-1 to 10-n are commonly used for neighboring memory cell array blocks 10-1 to 10-n. Each of bit line isolation gates ISOG1 to ISOGn is composed of NMOS transistors N1, N2 and is connected between array bit line pairs (ABL1/B, ABL2/B, ABL3/B, ABL4/B, . . . ) and sense bit line pairs (SBL1/B, SBL2/B, SBL3/B, SBL4/B, . . . ) of each of memory cell array blocks 10-1 to 10-n. Each of write column selection gates WYG11 to WYGnn is composed of NMOS transistors N3 and N4, and is connected between corresponding sense bit line pairs SBL1/B, SBL2/B, SBL3/B, SBL4/B, . . . and local write line pairs LW11/B, LW12/B, LW13/B, LW14/B, . . . , LW(n−1)3/B, LW(n−1)4/B, LWn1/B, LWn2/B of each of memory cell array blocks 10-1 and 10-n. Each of read column selection gates RYG11 to RYGnn is composed of NMOS transistors N5, N6 and is connected between corresponding sense bit line pairs SBL1/B, SBL2/B, SBL3/B, SBL4/B, . . . and local read line pairs LR11/B, LR12/B, LR13/B, LR14/B, . . . , LR(n−1)3/B, LR(n−1)4/B, LRn1/B, LRn2/B of each of memory cell array blocks 10-1 to 10-n.

Local write line pairs LW11/B to LWn1/B are connected to a global write line pair GW1/B, and local write line pairs LW12/B to LWn2/B are connected to a global write line pair GW2/B. Local write line pairs LW13/B to LW(n−1)3/B are connected to a global write line pair GW3/B, and local write line pairs LW14/B to LW(n−1)4/B are connected to a global write line pair GW4/B. Likewise, local read line pairs LR11/B to LRn1/B are connected to a global read line pair GR1/B, and local read line pairs LR12/B to LRn2/B are connected to a global read line pair GR2/B. Local read line pairs LR13/B to LR(n−1)3/B are connected to a global read line pair GR3/B, and local read line pairs LR14/B to LR(n−1)4/B are connected to a global read line pair GR4/B.

In FIG. 1, DQI and DQO denote a data input pad and a data output pad, respectively. And, WL, WY1 and RY1 denote a representative word line, a representative write column selection signal and a representative read column selection signal, respectively.

The semiconductor memory device shown in FIG. 1 has a construction wherein a memory cell block is selected during write and read operations and data are input and output to and from a selected memory cell array block by 4 bits.

The construction of the semiconductor memory device shown in FIG. 1 is described below.

Each of memory cell array blocks 10-1 to 10-n stores data transmitted from corresponding local write line pairs (LW11/B, LW12/B, LW13/B, LW14/B) to (LW(n−1)3/B, LW(n−1)4/B, LWn1/B, LWn2/B) in selected memory cell(s) during a write operation, and transmits data stored in the selected memory cell(s) to corresponding local read line pairs (LR11/B, LR12/B, LR13/B, LR14/B) to (LR(n−1)3/B, LR(n−1)4/B, LRn1/B, LRn2/B) during a read operation. Each of bit line isolation gates ISOG1 to ISOGn transmits data between each of array bit line pairs ABL1/B, ABL2/B, ABL3/B, ABL4/B, . . . , and each of sense bit line pairs SBL1/B, SBL2/B, SBL3/B, SBL4/B, . . . in response to each of isolation control signals ISO1, ISO2, . . , ISOn). Each of isolation control signals ISO1, ISO2, . . . , ISOn is activated in response to a block selection signal for selecting each of memory cell array blocks 10-1 to 10-n. The block selection signal is generated by decoding a block address among row addresses RA. Write column selection gates WYG11, WYG12, . . . , WYG(n−1)n, WYGnn transmit data between each of array bit line pairs ABL1/B, ABL2/B, ABL3/B, ABL4/B and each of local write line pairs (LW11/B, LW12/B, LW13/B, LW14/B, . . . , (LW(n−1)3/B, LW(n−1)4/B, LWn1/B, LWn2/B) when they are turned on in response to a write column selection signal WY1. Read column selection gates RYG11, RYG12, . . . RYG(n−1)n, RYGnn transmit data between each of array bit line pairs ABL1/B, ABL2/B, ABL3/B, ABL4/B and each of local read line pairs (LR11/B, LR12/B, LR13/B, LR14/B, . . . , (LR(n−1)3/B, LR(n−1)4/B, LRn1/B, LRn2/B) when they are turned on in response to a read column selection signal RY1. The row decoder 12 decodes the row address RA in response to an active command ACT and generates a word line selection signal for selecting one of the word lines. The read column decoder 14-1 decodes a column address CA and generates read column selection signals RY1, . . . in response to a read command RE. The write column decoder 14-2 decodes the column address CA in response to a write command WE and generates write column selection signals WY1, . . . . The data input circuit 16 inputs data input through the data input pad DQI and outputs them to global write line pairs GW1/B, GW2/B, GW3/B, GW4/B. The data output circuit 18 inputs data output to global read line pairs GR1/B, GR2/B, GR3/B, GR4/B and outputs them to the data output pad DQO.

Figure 2:
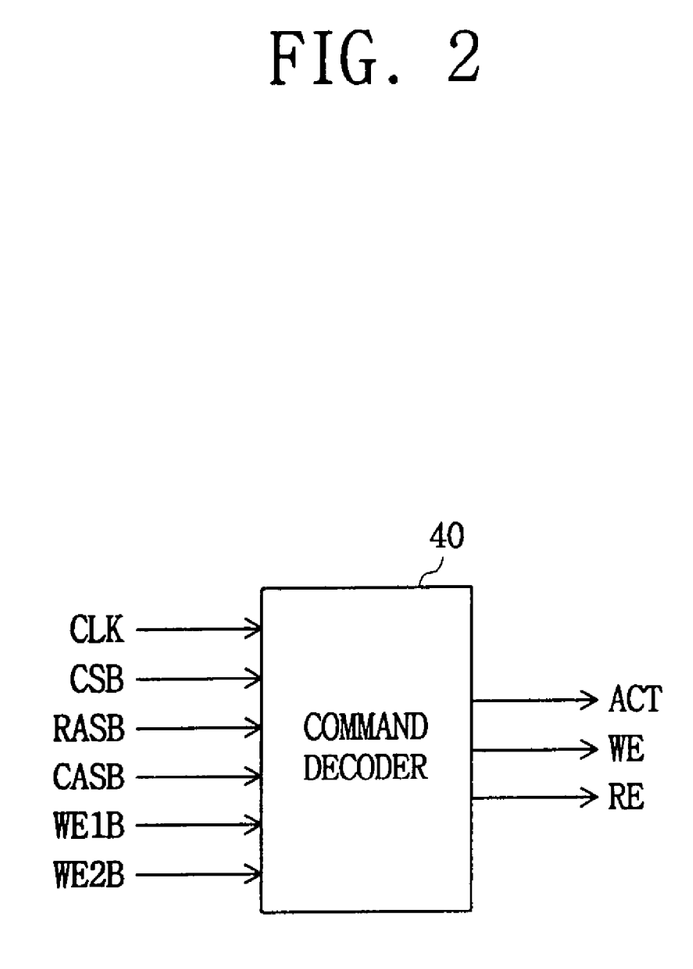
FIG. 2 is a block diagram illustrating a command decoder of a semiconductor memory device shown in FIG. 1 in accordance with an embodiment of the present invention.

FIG. 2 is a block diagram illustrating a command decoder of a semiconductor memory device shown in FIG. 1 in accordance with an embodiment of the present invention. A command decoder 40 shown in FIG. 2 decodes a clock signal CLK, an inverted chip selection signal CSB, an inverted row address strobe signal RASB, an inverted column address strobe signal CASB, a first inverted write enable signal WELB, and a second inverted write enable signal WE2B, and generate an active command ACT, a write command WE, and a read command RE.

The command decoder shown in FIG. 2 implements operations described in the table below.

TABLE

| CLK | CSB | RASB | CASB | WE1B | WE2B | Internal commands |
|---|---|---|---|---|---|---|
| ⌐ | L | L | H | H | H | ACT |
| ⌐ | L | H | L | L | H | WE |
| ⌐ | L | H | L | H | H | RE |
| ⌐ | L | H | L | L | L | WE, RE |

In the above table, H denotes "high" and L denotes "low".

The command decoder 40 generates an active command ACT when low-level command signals CSB, RASB and high-level command signals CASB, WE1B, WE2B are applied at a rising edge of a clock signal CLK, and generates a write command WE when low-level command signals CSB, CASB, WE1B, and high-level command signals RASB, WE2B are applied at the rising edge of the clock signal CLK. The command decoder 40 generates the read command RE when low-level command signals CSB, CASB and high-level command signals RASB, WE1B, WE2B are applied, and generates the write command WE and the read command RE simultaneously when low-level command signals CSB, CASB, WE1B, WE2B and a high-level command signal RASB are applied.

That is, the command decoder of the semiconductor memory device in accordance with the present invention can generate not only an active command ACT, a read command RE, or a write command WE independently but also a write command WE and a read command RE simultaneously.

Moreover, in case that the command decoder of the semiconductor memory device in accordance with the present invention is constituted not to generate the write command WE and the read command RE simultaneously, the second inverted write enable signal WE2B is not needed. That is, the command decoder can be constituted like that of general semiconductor memory devices. Even though generation of a free charge command and a mode establishment command is not described in the description of the command decoder of FIG. 2, the pre-charge command and the mode establishment command are generated using the same method of the command decoder of a general semiconductor memory device.

Figure 3:
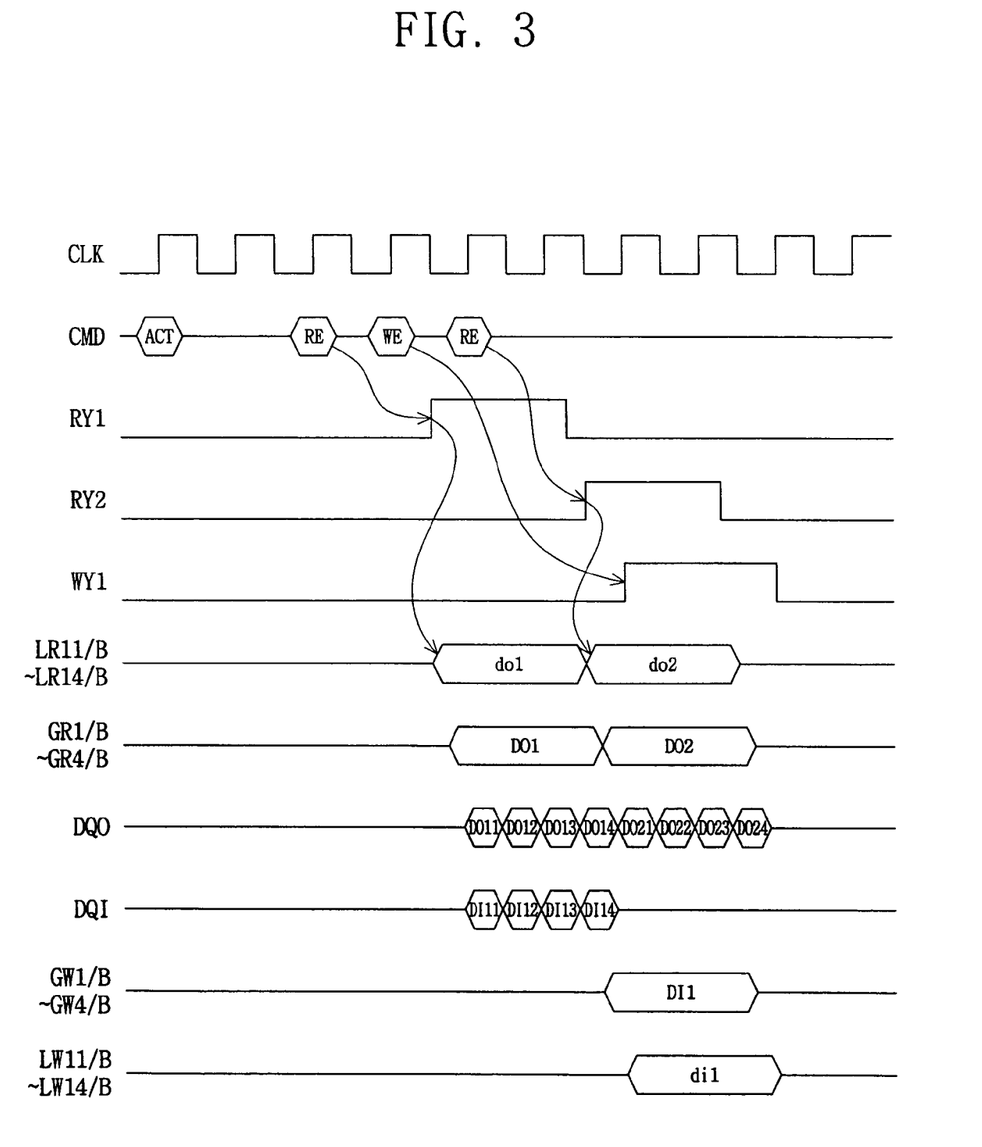
FIG. 3 is an operational timing diagram illustrating data write and read operations of the construction shown in FIG. 1 in accordance with an embodiment of the present invention.

FIG. 3 is an operational timing diagram illustrating data write and read operations of a construction shown in FIG. 1 in accordance with an embodiment of the present invention. The timing diagram of FIG. 3 indicates operation of a double data rate semiconductor memory device in the case in which an active command, a read command, a write command and a read command are continuously applied, CAS latency is 2, write latency is 1, and burst length is 4.

Operation of a construction shown in FIG. 1 using FIG. 3 is described below.

When an active command ACT and a row address RA are applied, a row decoder 12 activates a word line selection signal for selecting a word line WL1 of a plurality of word lines. And a bit line isolation control signal ISO1 is activated in response to a block address. Then, bit line isolation gates ISOG1 are turned on. And then, a charge sharing operation is implemented between memory cells connected to the word line WL1 and array bit line pairs ABL1/B, ABL2/B, ABL3/B, ABL4/B, . . . of a memory cell array block 10-1. Accordingly, a voltage difference occurs among sense bit line pairs SBL1/B, SBL2/B, SBL3/B, SBL4/B, . . . connected to the array bit line pairs ABL1/B, ABL2/B, ABL3/B, ABL4/B, . . . . Here, bit line sense amplifiers (not shown) operate to amplify signals of the array bit line pairs ABL1/B, ABL2/B, ABL3/B, ABL4/B, and the sense bit line pairs SBL1/B, SBL2/B, SBL3/B, . . . to a supply voltage level and a ground voltage level.

When a first read command RE is input together with a column address CA, a read column decoder 14-1 decodes the column address CA and then activates the read column selection signal RY1. Then, read column gates RYG11, RYG12 are turned on and data of sense bit line pairs SBL1/B to SBL4/B are transmitted to local read line pairs LR11/B to LR14/B. And, data do1 transmitted to local read line pairs LR11/B to LR14/B is transmitted to the global read line pairs GR1/B to GR4/B. A data output circuit 18 serially transforms data DO1 of the global read line pairs GR1/B to GR4/B and sequentially outputs data DO11 to DO14 through the data output pad DQO.

After one clock cycle from application of a first read command RE, the column address CA is input together with the write command WE. After one cycle from application of the write command WE, when serial data DI11 to DI14 of 4 bits are input through the data input pad DQI, the data input circuit 16 transforms the serial data of 4 bits into parallel data and outputs them to global write line pairs GW1/B to GW4/B. Here, in response to the first read command RE, data DO11 to DO14 are output through the data output pad DQO. That is, data are input and output simultaneously through the data input pad DQI and the data output pad DQO. Data DI1 transmitted to global write line pairs GW1/B to GW4/B are also transmitted to local write line pairs LW11/B to LW14/B. A write column decoder 14-2 decodes the column address CA input together with the write command WE and activates the write column selection signal WY1. Then, write column gates WYG11, WYG12 are turned on. And then, data DI1 transmitted to global write line pairs GW1/B to GW4/B are also transmitted to local write line pairs LW11/B to LW14/B. After then, data di1 transmitted to local write line pairs LW11/B to LW14/B are transmitted to sense bit line pairs SBL1/B to SBL4/B and array bit line pairs BL1/B to BL4/B through write column selection gates WYG11, WYG12.

After one clock cycle from application of the write command WE, when the column address CA is input together with a second read command RE, a read column selection signal RY2 is generated, and data are transmitted to local read line pairs LR11/B to LR14/B in response to the read column selection signal RY2. Here, data di1 are transmitted to local write line pairs LW11/B to LW14/B. Then, data do1 transmitted to local read line pairs LR11/B to LR14/B are transmitted to global read line pairs GR1/B to GR4/B. Here, data DI1 are transmitted to global write line pairs GW1/B to GW4/B. Then, the data output circuit 18 serially transforms parallel data of 4 bits transmitted to global read line pairs GR1/B to GR4/B. Serially transformed data DO21 to DO24 are output sequentially through the data output pad DQO. That is, when data DI11 to DI14 are transmitted to global write line pairs GW1/B to GW4/B and local write line pairs LW11/B to LW14/B in response to the write command WE, data of local read line pairs LR11/B to LR14/B are transmitted to global read line pairs GR1/B to GR4/B and the data output pad DQO in response to the second read command RE.

In the above description, the case where a word line WL1 and array bit line pairs ABL1/B to ABL4/B are activated and memory cell array block 10-1 are selected in write and read operations is described.

That is, the semiconductor memory device in accordance with the present invention can input and output date simultaneously without data collision as shown in FIG. 2 since data write line pairs and data read line pairs are separately constituted.

Figure 4:
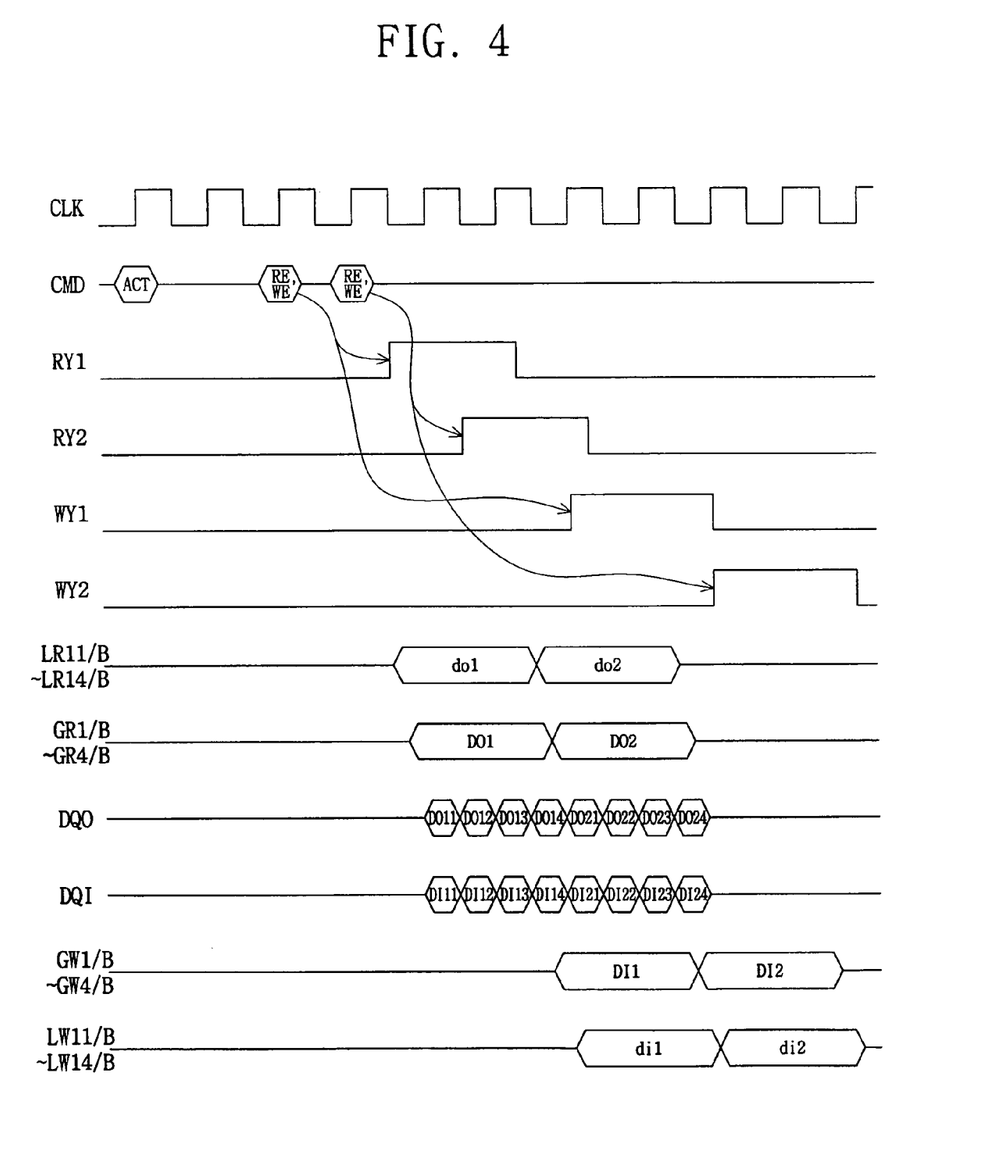
FIG. 4 is an operational timing diagram illustrating data write and read operations of the construction shown in FIG. 1 in accordance with another embodiment of the present invention.

FIG. 4 is an operational timing diagram illustrating data write and read operations of a construction shown in FIG. 1 in accordance with another embodiment of the present invention. The operational timing diagram illustrates operation of a double data rate semiconductor memory device in the case in which an active command, read and write commands, and write and read commands are applied simultaneously and continuously, CAS latency is 2, write latency is 1, and burst length is 4. That is, the operational timing diagram shown in FIG. 4 illustrates an operation of case that a read command and a write command for same memory cell are applied simultaneously.

Operation of a construction shown in FIG. 1 using FIG. 4 is described below.

Operation in the case in which an active command ACT is applied can be understood with reference to the description of operation of FIG. 2.

When a column address CA is input together with read and write commands RE, WE, the read column decoder 14-1 decodes the column address CA and activates a read column selection signal RY1, and a write column decoder 14-2 decodes the column address CA and activates a write column selection signal WY1. Then, read column gates RYG11, RYG12 are turned on and data of sense bit line pairs SBL1/B to SBL4/B are transmitted to local read line pairs LR11/B to LR14/B. And then, data do1 transmitted to local read line pairs LR11/B to LR14/B are transmitted to global read line pairs GR1/B to GR4/B. Data DO1 transmitted to global read line pairs GR1/B to GR4/B are output through the data output pad DQO. When data DO11 to DO14 are output through the data output pad DQO, serial data DI11 to DI14 of 4 bits are input through the data input pad DQ1. That is, data are input and output simultaneously through the data input pad DQ1 and the data output pad DQO. Then, the data input circuit 16 transforms serial data of 4 bits to parallel data and transmits them to global write line pairs GW1/B to GW4/B. Data DI1 transmitted to global write line pairs GW1/B to GW4/B are transmitted to local write line pairs LW11/B to LW14/B. Data transmitted to local write line pairs LW11/B to LW14/B are transmitted to sense bit line pairs SBL1/B to SBL4/B.

Then, when the column address CA is input together with write and read commands WE, RE, data DO21, DO22, DO23, DO24 are output through the data output pad DQO by performing the same operations described above, and an operation for inputting data DI21, DI22, DI23, DI24 through the data input pad DQI is performed simultaneously. That is, when data are input through the data input pad DQI, global write line pairs GW1/B to GW4/B and local write line pairs LW11/B to LW14/B in response to the first write command WE, data are output through local read line pairs LR11/B to LR14/B, global read line pairs GR1/B to GR4/B, and the data output pad DQO in response to the second read command RE.

That is, the semiconductor memory device in accordance with the present invention can input and output data simultaneously without data collision even in the case in which write and read commands are applied simultaneously.

Though an operation of the semiconductor memory device in accordance with the present invention is described using separated timing diagrams of FIGS. 3 and 4, operations shown in timing diagrams of FIGS. 3 and 4 can be continuously performed. That is, even in case that write and read commands WE, RE are continuously generated from the command decoder 40 of FIG. 2, data can be input and output simultaneously without data collision.

As described above, the semiconductor memory device in accordance with the present invention is fixed to use the data input pads for inputting data only and the data output pads for outputting data only.

Figure 5:
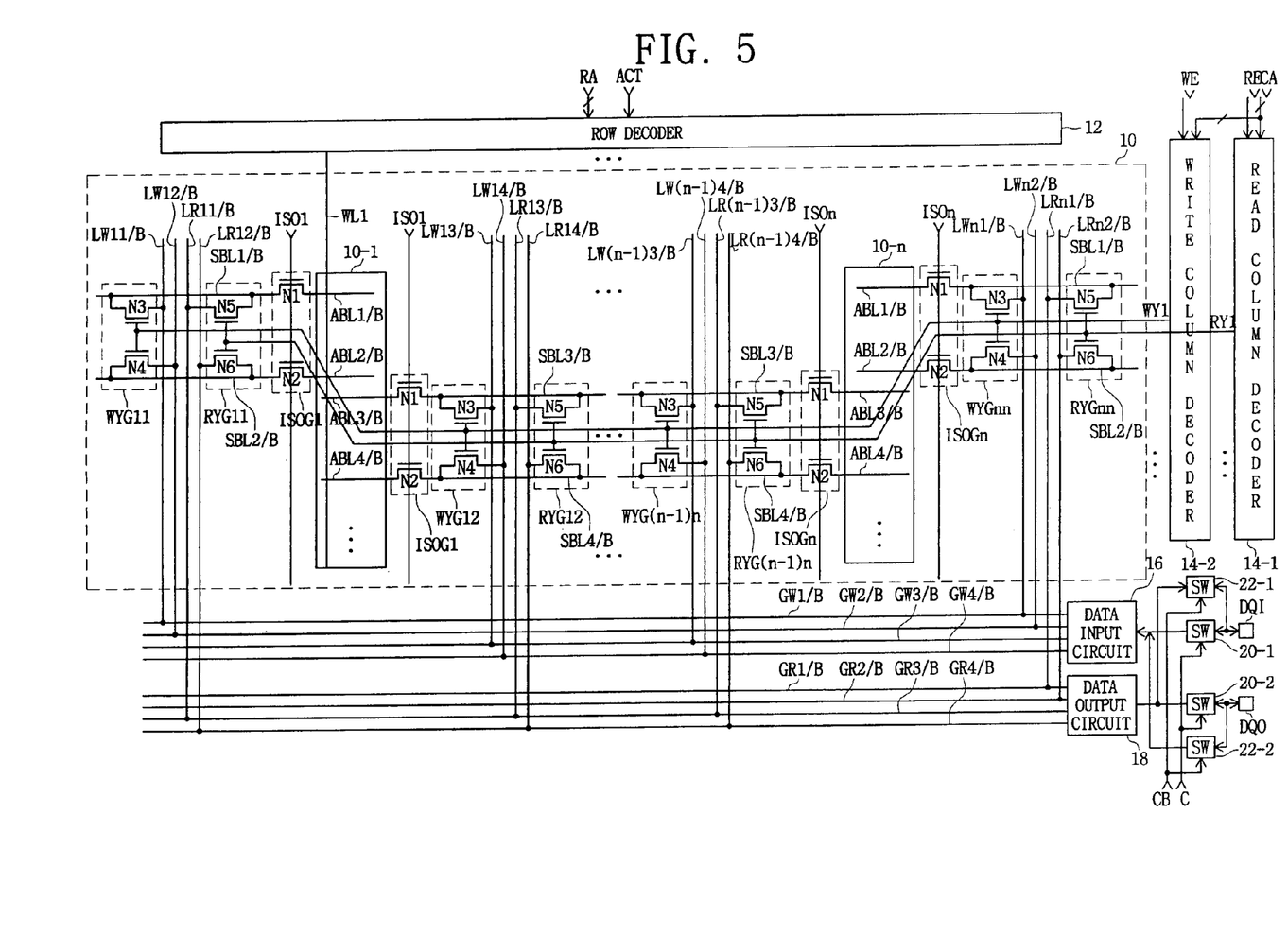
FIG. 5 is a block diagram illustrating a construction of a semiconductor memory device in accordance with another embodiment of the present invention.

FIG. 5 is a block diagram illustrating a construction of a semiconductor memory device in accordance with another embodiment of the present invention, additionally including switches 20-1, 20-2, 22-1, 22-2 in FIG. 1.

Referring to FIG. 5, each of switches 20-1, 20-2 is connected between data input circuit 16 and data input pad DQI, and between the data output circuit 18 and the data output pad DQO, and each of switches 22-1, 22-2 is connected between the data output circuit 18 and the data input pad DQI, and between the data input circuit 16 and the data output pad DQO.

Function of a construction shown in FIG. 5 is described below.

When a low-level control signal C and a high-level inverted control signal CB are generated, switches 20-1, 20-2 are turned on and data input through data input pad DQI are input to data input circuit 16, and data output through data output circuit 18 are output to data output pad DQO.

On the contrary, when a high-level control signal C and a low-level inverted control signal CB are generated, switches 22-1, 22-2 are turned on and data input through the data output pad DQO are input to data input circuit 16, and data output through data output circuit 18 are output to the data input pad DQI.

The semiconductor memory device shown in FIG. 5 uses the data input pad DQI to input or output data in response to the control signal C, and the data output pad DQO to output or input data likewise.

Accordingly, data input pad DQI and data output pad DQO of the semiconductor memory device in accordance with the present invention are not fixed in their functions, and the data input pad DQI can be used as data output pad DQO and vice versa.

Referring to FIG. 5, the control signal C can be set by using mode set codes input to a mode set register (not shown) in response to a mode set command of the semiconductor memory device. Further explanation of it is omitted since this technology is commonly used in the field of semiconductor memory devices.

Operation of the semiconductor memory device shown in FIG. 5 can be understood with reference to FIGS. 2 and 3.

In the embodiment described above, operation of the present invention are described using the case in which the CAS latency is 2, the write latency is 1, the burst length is 4, and the semiconductor memory device is operated in double data rate. However, the semiconductor memory device of the present invention is also operated in case that the CAS latency, the write latency and the burst length are different from those of the embodiment, and the semiconductor memory device is operated in a single data rate or a quad data rate instead of the double data rate.

In a semiconductor memory device and a method for writing and reading data to and from the same in accordance with the present invention, data can be input and output simultaneously through data input pads and data output pads.

In a semiconductor memory device and a method for writing and reading data to and from the same in accordance with the present invention, data input pads are used as data output pads and vice versa under certain circumstances.

Accordingly, it is possible to enhance bus efficiency of a system using a semiconductor memory device of the present invention.

While this invention has been described in connection with what is presently considered to be the most practical and preferred embodiment, it is to be understood that the invention is not limited to the disclosed embodiment, but on the contrary, it is intended to cover various modification within the spirit and scope of the appended claims.

What is claimed is:

1. A semiconductor memory device comprising:
    a memory cell array including a plurality of memory cells connected between a plurality of word lines and a plurality of bit line pairs;
    a predetermined number of write line pairs;
    a predetermined number of read line pairs;
    at least one data input pad;
    at least one data output pad;
    a data input circuit between the at least one data input pad and the predetermined number of write line pairs for transmitting first data which is applied through the at least one data input pad to the predetermined number of write line pairs as second data during a write operation;
    a plurality of write column selection gates for receiving the first data from the data input circuit and transmitting the second data between the plurality of bit line pairs and the predetermined number of write line pairs in response to a write column selection signal during the write operation;
    a plurality of read column selection gates for transmitting third data between the plurality of bit line pairs and the predetermined number of read line pairs in response to a read column selection signal during a read operation; and
    a data output circuit between the at least one data output pad and the predetermined number of read line pairs for outputting the third data as fourth data during the read operation, wherein the fourth data is output through the at least one data output pad, and wherein the first data is input through the at least one data input pad during the write operation and the fourth data is output through the at least one data output pad during the read operation simultaneously.

2. The semiconductor memory device according to claim 1, further comprising a command decoder for decoding externally input command signals and generating a write command for the write operation and a read command for the read operation.

3. The semiconductor memory device according to claim 2, wherein the command decoder further decodes the command signals to generate write and read commands for performing the write and read operations simultaneously.

4. A semiconductor memory device comprising:
    a memory cell array including a plurality of memory cell array blocks each including a plurality of memory cells connected between a plurality of word lines and a plurality of bit line pairs;
    a predetermined number of local write line pairs of each of the plurality of memory cell array blocks for inputting data in each of the plurality of memory cell array blocks;
    a predetermined number of local read line pairs of each of the plurality of memory cell array blocks for outputting data of each of the plurality of memory cell array blocks;
    a plurality of write column selection gates of each of the plurality of memory cell array blocks for transmitting data between the plurality of bit line pairs and the predetermined number of local write line pairs during a write operation;

read column selection gates of each of the plurality of memory cell array blocks for transmitting data between the plurality of bit line pairs and the predetermined number of local read line pairs during a read operation;

a predetermined number of global write line pairs connected to the predetermined number of local write line pairs of each of the plurality of memory cell array blocks;

a predetermined number of global read line pairs connected to the predetermined number of local read line pairs of each of the plurality of memory cell array blocks;

a first switch for transmitting data input through a predetermined number of data input pads to the predetermined number of global line pairs in response to a control signal, and outputting data transmitted from the predetermined number of global read line pairs to a predetermined number of data output pads; and a second switch for transmitting data input through the predetermined number of data output pads to the predetermined number of global line pairs in response to an inverted signal of the control signal, and outputting data transmitted from the predetermined number of global read line pairs to the predetermined number of data input pads.

5. The semiconductor memory device according to claim 4, further comprising a command decoder for decoding externally input command signals and generating a write command for the write operation and a read command for the read operation.

6. The semiconductor memory device according to claim 5, wherein the command decoder further generates write and read commands for performing the write and the read operations simultaneously after decoding the commands.

7. A semiconductor memory device comprising:

a memory cell array including a plurality of memory cell array blocks each including a plurality of memory cells connected between a plurality of word lines and a plurality of bit line pairs;

a predetermined number of local write line pairs of each of the plurality of memory cell array blocks for inputting data in each of the plurality of memory cell array blocks;

a predetermined number of local read line pairs of each of the plurality of memory cell array blocks for outputting data of each of the plurality of memory cell array blocks;

at least one data input pad;

at least one data output pad;

a plurality of write column selection gates of each of the plurality of memory cell array blocks for transmitting data between the plurality of bit line pairs and the predetermined number of local write line pairs in response to write column selection signals during a write operation;

read column selection gates of each of the plurality of memory cell array blocks for transmitting data between the plurality of bit line pairs and the predetermined number of local read line pairs in response to read column selection signals during a road operation;

a write column decoder for generating the write column selection signals to select a predetermined number of write column selection gates among the plurality of write column selection gates by inputting a column address during the write operation;

a read column decoder for generating the read column selection signals to select a predetermined number of read column selection gates among the plurality of read column selection gates by inputting the column address during the read operation;

a predetermined number of global write line pairs connected to a predetermined number of local write line pairs of each of the plurality of memory cell array blocks;

a predetermined number of global read line pairs connected to a predetermined number of local read line pairs of each of the plurality of memory cell array blocks;

a data input circuit between the at least one data input pad and the predetermined number of global write line pairs for transmitting data input from the at least one data input pad to the predetermined number of global write line pairs;

a data output circuit between the at least one data output pad and the global read line pairs for outputting data transmitted from the predetermined number of global read line pairs to the at least one data output pad; and a command decoder for decoding externally input command signals and generating a write command for the write operation and a road instruction for the read operation, wherein the command decoder decodes the command signals and further generates the write and the read commands for performing the write and the read operations simultaneously, and wherein the data transmitted from the at least one data input pad is transmitted during the write operation and the data output to the at least one data output pad is output during the read operation simultaneously.

8. The semiconductor memory device according to claim 7, further comprising:

a first switch for transmitting data input to a predetermined number of data input pads to the data input circuit in response to a control signal, and transmitting data transmitted from the data output circuit to a predetermined number of data output pads; and a second switch for transmitting data input through the predetermined number of data output pads to the data input circuit in response to an inverted signal of the control signal, and transmitting data output from the data output circuit to the predetermined number of data input pads.

9. A method for writing and reading data to and from a semiconductor memory device comprising the steps of:

transmitting data input through a data input pad on an input side of a data input circuit to a global write line pair on an output side of the data input circuit during a write operation, and transmitting data stored in a memory cell array to a local read line pair during a read operation in response to a read column selection signal;

transmitting data transmitted to the gobal write line pair to a local write line pair in response to a write column selection signal during the write operation, and transmitting data transmitted to the local read line pair to a global read line pair during the read operation; and transmitting data transmitted to the local write line pair to the memory cell array during the write operation, and transmitting data transmitted to the global read line pair on an input side of a data output circuit to a data output pad on an output side of the data output circuit during the read operation, wherein the data transmitted through the data input pad and the data transmitted through the data output pad are transmitted simultaneously.

10. The method according to claim 9, wherein the write operation and the read operation are performed independently.

11. A semiconductor memory device comprising:
a memory cell array including a plurality of memory cell array blocks each including a plurality of memory cells connected between a plurality of word lines and a plurality of bit line pairs;
a predetermined number of local write line pairs of each of the plurality of memory cell array blocks for inputting data in each of the plurality of memory cell array blocks;
a predetermined number of local read line pairs of each of the plurality of memory cell array blocks for outputting data of each of the plurality of memory cell array blocks;
a plurality of write column selection gates of each of the plurality of memory cell array blocks for transmitting data between the plurality of bit line pairs and the predetermined number of local write line pairs in response to a write column selection signal during a write operation;
read column selection gates of each of the plurality of memory cell array blocks for transmitting data between the plurality of bit line pairs and the predetermined number of local read line pairs in response to a read column selection signal during a read operation;
a predetermined number of global write line pairs connected to the predetermined number of local write line pairs of each of the plurality of memory cell array blocks, wherein the predetermined number of global write line pairs receives data input from at least one data input pad; and
a predetermined number of global read line pairs connected to the predetermined number of local read line pairs of each of the plurality of memory cell array blocks, wherein the predetermined number of global read line pairs outputs data transmitted from the predetermined number of global read line pairs to at least one data output pad, and wherein the data transmitted from the predetermined number of global read line pairs is received by the at least one data output pad and the data input from at least one data input pad is input through the at least one data input pad simultaneously; and
a command decoder for decoding externally input command signals and generating a write command for the write operation and a read command for the read operation, wherein the command decoder further generates write and read commands for performing the write and the read operations simultaneously after decoding the commands.

12. The semiconductor memory device according to claim 11, further comprising:
a first switch for transmitting data input through a predetermined number of data input pads to the predetermined number of global line pairs in response to a control signal, and outputting data transmitted from the predetermined number of global read line pairs to a predetermined number of data output pads; and
a second switch for transmitting data input through the predetermined number of data output pads to the predetermined number of global line pairs in response to an inverted signal of the control signal, and outputting data transmitted from the predetermined number of global read line pairs to the predetermined number of data input pads.

13. A semiconductor memory device comprising:
a memory cell array including a plurality of memory cell array blocks each including a plurality of memory cells connected between a plurality of word lines and a plurality of bit line pairs;
a predetermined number of local write line pairs of each of the plurality of memory cell array blocks for inputting data in each of the plurality of memory cell array blocks;
a predetermined number of local read line pairs of each of the plurality of memory cell array blocks for outputting data of each of the plurality of memory cell array blocks;
a plurality of write column selection gates of each of the plurality of memory cell array blocks for transmitting data between the plurality of bit line pairs and the predetermined number of local write line pairs during a write operation;
read column selection gates of each of the plurality of memory cell array blocks for transmitting data between the plurality of bit line pairs and the predetermined number of local read line pairs during a read operation;
a write column decoder for generating write column selection signals to select a predetermined number of write column selection gates among the plurality of write column selection gates by inputting a column address during the write operation;
a read column decoder for generating read column selection signals to select a predetermined number of read column selection gates among the plurality of read column selection gates by inputting the column address during the read operation;
a predetermined number of global write line pairs connected to a predetermined number of local write line pairs of each of the plurality of memory cell array blocks;
a predetermined number of global read line pairs connected to a predetermined number of local read line pairs of each of the plurality of memory cell array blocks;
a data input circuit for transmitting data input to a predetermined number of data input pads to the predetermined number of global write line pairs;
a data output circuit for outputting data transmitted from the predetermined number of global read line pairs to a predetermined number of data output pads; and
a command decoder for decoding externally input command signals and generating a write command for the write operation and a read instruction for the read operation;
a first switch for transmitting data input to a predetermined number of data input pads to the data input circuit in response to a control signal, and transmitting data transmitted from the data output circuit to a predetermined number of data output pads; and
a second switch for transmitting data input through the predetermined number of data output pads to the data input circuit in response to an inverted signal of the control signal, and transmitting data output from the data output circuit to the predetermined number of data input pads.

14. The semiconductor memory device according to claim 13, wherein the command decoder decodes the command signals and further generates the write and the read commands for performing the write and the read operations simultaneously.

15. A semiconductor memory device comprising:
a memory cell array including a plurality of memory cell array blocks each including a plurality of memory cells connected between a plurality of word lines and a plurality of bit line pairs;
a predetermined number of local write line pairs of each of the plurality of memory cell array blocks for inputting data in each of the plurality of memory cell array blocks;
a predetermined number of local read line pairs of each of the plurality of memory cell array blocks for outputting data of each of the plurality of memory cell array blocks;
a plurality of write column selection gates of each of the plurality of memory cell array blocks for transmitting data between the plurality of bit line pairs and the predetermined number of local write line pairs during a write operation;
read column selection gates of each of the plurality of memory cell array blocks for transmitting data between the plurality of bit line pairs and the predetermined number of local read line pairs during a read operation;
a write column decoder for generating write column selection signals to select a predetermined number of write column selection gates among the plurality of write column selection gates by inputting a column address during the write operation;
a read column decoder for generating read column selection signals to select a predetermined number of read column selection gates among the plurality of read column selection gates by inputting the column address during the read operation;
a predetermined number of global write line pairs connected to a predetermined number of local write line pairs of each of the plurality of memory cell array blocks;
a predetermined number of global read line pairs connected to a predetermined number of local read line pairs of each of the plurality of memory cell array blocks;
a data input circuit for transmitting data input from a predetermined number of data input pads to the predetermined number of global write line pairs;
a data output circuit for outputting data transmitted from the predetermined number of global read line pairs to a predetermined number of data output pads;
a command decoder for decoding externally input command signals and generating a write command for the write operation and a read instruction for the read operation, wherein the command decoder decodes the command signals and further generates the write and the read commands for performing the write and the read operations simultaneously;
a first switch for transmitting data input to the predetermined number of data input pads to the data input circuit in response to a control signal, and transmitting data transmitted from the data output circuit to the predetermined number of data output pads; and
a second switch for transmitting data input through the predetermined number of data output pads to the data input circuit in response to an inverted signal of the control signal, and transmitting data output from the data output circuit to the predetermined number of data input pads.

16. A semiconductor memory device comprising:
a memory cell array including a plurality of memory cell array blocks each including a plurality of memory cells connected between a plurality of word lines and a plurality of bit line pairs;
a predetermined number of local write line pairs of each of the plurality of memory cell array blocks for inputting data in each of the plurality of memory cell array blocks;
a predetermined number of local read line pairs of each of the plurality of memory cell array blocks for outputting data of each of the plurality of memory cell array blocks;
a plurality of write column selection gates of each of the plurality of memory cell array blocks for transmitting data between the plurality of bit line pairs and the predetermined number of local write line pairs during a write operation;
read column selection gates of each of the plurality of memory cell array blocks for transmitting data between the plurality of bit line pairs and the predetermined number of local read line pairs during a read operation;
a predetermined number of global write line pairs connected to the predetermined number of local write line pairs of each of the plurality of memory cell array blocks;
a predetermined number of global read line pairs connected to the predetermined number of local read line pairs of each of the plurality of memory cell array blocks;
a command decoder for decoding externally input command signals and generating a write command for the write operation and a read command for the read operation, wherein the command decoder further generates write and read commands for performing the write and the read operations simultaneously after decoding the commands;
a first switch for transmitting data input through a predetermined number of data input pads to the predetermined number of global line pairs in response to a control signal, and outputting data transmitted from the predetermined number of global read line pairs to a predetermined number of data output pads; and
a second switch for transmitting data input through the predetermined number of data output pads to the predetermined number of global line pairs in response to an inverted signal of the control signal, and outputting data transmitted from the predetermined number of global read line pairs to the predetermined number of data input pads.

* * * * *

UNITED STATES PATENT AND TRADEMARK OFFICE
CERTIFICATE OF CORRECTION

PATENT NO. : 7,196,941 B2 Page 1 of 1
APPLICATION NO. : 10/798469
DATED : March 27, 2007
INVENTOR(S) : Lee et al.

It is certified that error appears in the above-identified patent and that said Letters Patent is hereby corrected as shown below:

Column 10, line 15 delete "predetennined" and insert --predetermined--

Column 11, line 64 delete "road" and insert --read--

Column 12, line 27 delete "road" and insert --read--

Column 12, line 57 delete "gobal" and insert --global--

Column 14, line 29 delete "gales" and insert --gates--

Signed and Sealed this

Sixteenth Day of October, 2007

JON W. DUDAS
*Director of the United States Patent and Trademark Office*